United States Patent [19]

Ermer et al.

[11] Patent Number: 4,798,660
[45] Date of Patent: Jan. 17, 1989

[54] METHOD FOR FORMING CU IN SE₂ FILMS

[75] Inventors: James H. Ermer, Los Angeles; Robert B. Love, Chatsworth, both of Calif.

[73] Assignee: Atlantic Richfield Company, Los Angeles, Calif.

[21] Appl. No.: 942,918

[22] Filed: Dec. 22, 1986

Related U.S. Application Data

[63] Continuation of Ser. No. 755,649, Jul. 16, 1985, abandoned.

[51] Int. Cl.⁴ .............................................. C23C 14/38
[52] U.S. Cl. ......................... 204/192.17; 204/192.25; 204/192.26
[58] Field of Search ...................... 204/192.25, 192.26, 204/192.17, 192.15; 136/264, 265

[56] References Cited

U.S. PATENT DOCUMENTS

| | | | |
|---|---|---|---|
| 4,335,266 | 6/1982 | Mickelsen et al. | 136/260 |
| 4,465,575 | 8/1984 | Love et al. | 204/192 S |
| 4,581,108 | 4/1986 | Kapur et al. | 204/37.1 |

OTHER PUBLICATIONS

T. L. Chu et al., Large Grain Copper Indium Diselenide Films, *J. Electrochem. Soc.: Solid State Science and Technology*, Sep. 1984, pp. 2182-2185.

J. L. Vossen et al., *Thin Film Processes*, Academic Press, New York, 1978, pp. 167-170.
S. P. Grindle et al., Preparation and Properties of CuInS₂ Thin Films . . . , *Appl. Phys. Lett.*, 35(1), Jul. 1, 1979, pp. 24-26.
J. Piekoszewski et al., RF-Sputtered CuInSe₂ Thin Films, *Solar Energy Materials*, 2(1980), pp. 363-372.
M. S. Tomar et al., A ZnO/p-CuInSe₂ Thin Film Solar Cell . . . , *Thin Solid Films*, 90(1982), pp. 419-423.
Chemical Vapor Deposited Copper Indium Diselenide Thin Film Materials Research, Poly Solar Inc., Garland, Tex., Mar. 1984, SERI/STR-211-2247.

*Primary Examiner*—John F. Niebling
*Assistant Examiner*—William T. Leader
*Attorney, Agent, or Firm*—Albert C. Metrailer

[57] ABSTRACT

A method for fabricating a copper indium diselenide semiconductor film comprising use of DC magnetron sputtering apparatus to sequentially deposit a first film of copper on a substrate and a second film of indium on the copper film. Thereafter the substrate with copper and indium films is heated in the presence of gas containing selenium at a temperature selected to cause interdiffusion of the elements and formation of a high quality copper indium diselenide film. In a preferred form, an insulating substrate is used and an electrical contact is first deposited thereon in the same DC magnetron sputtering apparatus prior to deposition of the copper and indium films.

7 Claims, 1 Drawing Sheet

METHOD FOR FORMING CU IN SE$_2$ FILMS

This application is a continuation of application Ser. No. 755,649, filed 7/16/85, now abandoned.

BACKGROUND OF THE INVENTION

The present invention relates to thin film heterojunction photovoltaic cells having copper indium diselenide (CIS) as an active semiconductor layer and more particularly to a method for forming such CIS films.

References which illustrate the background of photovoltaic devices including CIS semiconductor layers include U.S. Pat. NO. 4,335,266 issued to Mickelsen et al on June 15, 1982 and U.S. Pat. No. 4,465,575 issued to Love et al on Aug. 14, 1984. Both of these patents are hereby incorporated by reference. The Miceelsen patent provides considerable background information concerning development of CIS/cadimum sulfide (CdS) photovoltaic cells. Mickelsen teaches an improvement in the CIS deposition process involving the deposition of the CIS film in two sligthly different regions. The first region has an excess of copper while the second region, which is ultimately adjacent the CdS layer, is copper deficient. Diffusion between the two regions forms the desired CIS layer while reducing the probability of formation of pure copper nodules at the device junction. The CIS materials are deposited in Mickelsen using the reactive evaporation technique in which the three elements are simultaneously evaporated onto a heated substrate to form the compound semiconductor as deposited.

The Love et al patent teaches a different reactive deposition method for manufacturing the same type of device as Mickelsen et al. The primary difference is the use of DC magnetron sputtering devices to deposit the copper, indium and selenium. In a preferred form, Love uses Cu$_2$Se and In$_2$Se$_3$ targets to deposit CIS films. Alternatively, Love teaches codeposition of elemental copper, indium and selenium in a reactive deposition process.

Various other techniques have also been used to deposit CIS films. For example, the publication "RF-Sputtered CuInSe$_2$ Thin Films" by J. Piekoszewski et al, Solar Energy Materials 2(1980) 363-372, teaches the deposition of CIS films by RF sputtering from a synthesized target onto a heated substrate. Piekoszewski teaches that the particle size of powder from which the target is pressed is critical in terms of final film quality. Thus when a fine powder was used the resulting films were selenium deficient and indium rich. In the publication "Large Grain Copper Indium Diselenide Films" by T. L. Chu et al, J. Electrochem. Soc., September 1984, page 2182, two other film deposition techniques were discussed. These techniques involve either vacuum evaporation or electroplating of separate copper and indium films and then heat treatment of the resulting compound film in an atmosphere containing selenium. This publication notes that the control of the copper to indium ratio is essential and use of separate deposition steps enhances the ability to control the ratio of materials deposited.

Two other publications discuss other methods for depositing CIS films and teach photovoltaic structures in which a junction is formed between a CIS film and a zinc oxide film. The first of these is entitled "A ZnO/p-CuInSe$_2$ Thin Film Solar Cell Prepared Entirely by Spray Pyrolysis" by M. S. Tomar et al, Thin Solid Films, 90 (1982) 419-423. In Tomar, zinc oxide was deposited on a tin oxide coated glass substrate by spray pyrolysis at a substrate temperature of from 350° to 550° C. After similar deposition of a CIS layer, photovoltaic response of about 2% efficiency was measured. In the report entitled "Chemical Vapor Deposited Copper Indium Diselenide Thin Film Materials Research", Final Report, March 1984, SERI/STR-211-2247 by Poly Solar, Incorporated, zinc oxide films were ion beam sputtered onto CIS films which were deposited by a close space chemical vapor transport technique. Photovoltaic efficiencies in the range of 2 to 3% were achieved by such devices.

The above-referenced patents and publications indicate that much effort has been made to develop practical techniques for depositing high quality CIS films for use in making good photovoltaic devices. While reasonable efficiencies have been achieved for very small area research type devices, no good method has been found for manufacturing large area, for example, at least one foot by one foot, devices. As noted in the various publications, it is essential that the proper stoichiometric ratio of materials be deposited to form the film. This has proven to be difficult even in research devices. For the large commercial devices very good uniformity must be achieved across large surface areas on a repeatable basis.

SUMMARY OF THE INVENTION

Accordingly, an object of the present invention is to provide an improved method for depositing high quality copper indium diselenide films.

A copper indium diselenide film is deposited according to the present invention by using separate DC magnetron sputtering cathodes to first deposit a film of copper, then to deposit a separate film of indium on the first copper film, and then heating the composite film of copper and indium in the presence of a gas containing selenium to cause interdiffusion of the three elements and thereby form a high quality copper indium diselenide thin film. In a preferred form of the invention a photovoltaic device electrode is also deposited by a separate DC magnetron sputtering cathode on a substrate prior to deposition of the copper film and all of the films, that is the electrode, the copper and the indium, are deposited sequentially in a single vacuum chamber.

DESCRIPTION OF THE DRAWINGS

The present invention may be better understood by reading the following detailed description of the preferred embodiments with reference to accompanying drawings wherein.

DESCRIPTION OF THE PREFERRED EMBODIMENTS

Figure 1:
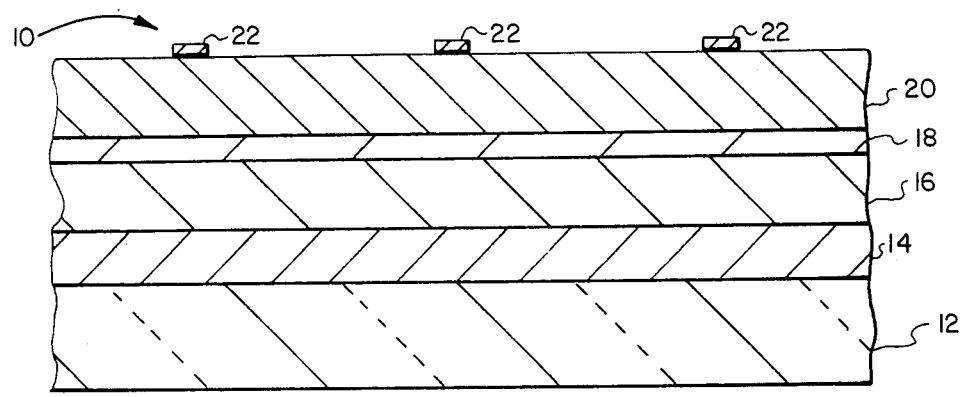
FIG. 1 is a cross-sectional illustration of a photovoltaic device according to the present invention.

With reference now to FIG. 1, there is provided a cross-sectional illustration of a portion of a photovoltaic cell 10 fabricated using the method of the present invention. Cell 10 is structurally supported on a glass substrate 12, preferably soda lime glass, which is about 1 to 3 millimeters thick. A back contact comprises a metal layer 14 deposited upon substrate 12. Layer 14 comprises primarily a film of molybdenum which has been deposited by sputtering to a thickness of from 0.2 to 2.0 microns. In the preferred form, an initial film of chromium having a thickness of from 100 to 500 angstroms is first deposited upon glass 12 to insure good adhesion of the overall device to the substrate 12. The first active region of the device 10 comprises a semiconductor layer 16 which is p-type copper indium diselenide having an overall thickness of from about 0.2 to 2 microns. The improved method for depositing layer 16 is described in more detail below. The second active portion of the device 10 comprises layers 18 and 20 of n-type of semiconductor material, such as CdS or ZnO. In the preferred embodiment, layers 18 and 20 are formed primarily of zinc oxide and are therefore essentially transparent to sunlight. Layer 18 is relatively pure zinc oxide having a high resistivity and having a thickness ranging from about 100 to 2000 angstroms. Layer 20 on the other hand includes various doping or alloy type materials to increase conductivity and has a thickness of about 10,000 angstroms. The device 10 is completed by a series of front face contacts 22 in the form of narrow metal strips which may be, for example, aluminum deposited by sputtering, evaporation or plating.

Figure 2:
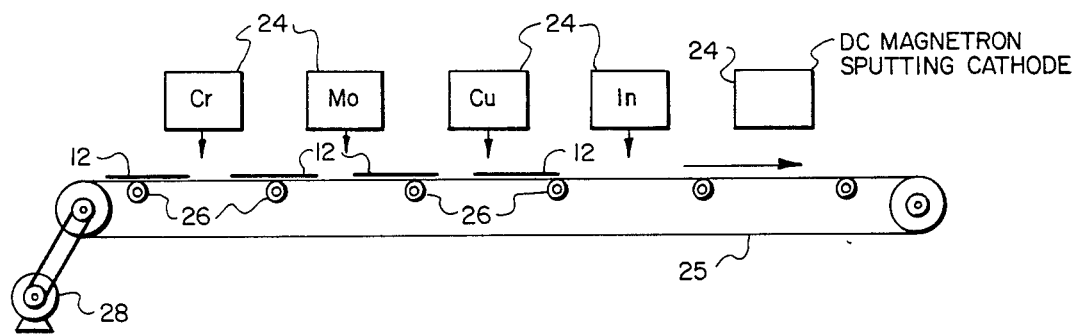
FIG. 2 is an illustration of magnetron sputtering apparatus used in the present invention.

With reference now to FIG. 2, there is provided a side view of a DC magnetron sputtering apparatus useful in the present invention with cathodes illustrated in block form. Such apparatus is well-known and commercially available. The equipment used in the preferred embodiment was acquired from Circuits Processing Apparatus, Inc. of Fremont, Calif. under the designation 9900 series. This unit included ten cathodes, although only five are illustrated in FIG. 2 for simplification. Though not illustrated, the apparatus of FIGURE 2 is housed in a vacuum chamber provided with loadlocks to allow substrates 12 to be placed into and taken from the chamber. The primary functional portions of the apparatus include the DC magnetron sputtering cathodes 24 which are generally linear in configuration and extend across the vacuum chamber. The apparatus used in developing the method of the present invention included ten of the magnetron sputtering cathodes 24. The apparatus also includes a pair of conveyor chains 25 supported on a series of rollers 26 and drive means 28 for moving the substrates 12 through the chamber at a controlled rate. Further details of the apparatus are provided in the above-referenced Love et al patent which has been incorporated by reference particularly for this purpose. While the cathodes 24 are illustrated as being above the substrate 12, they may also be placed on the bottom of the vacuum chamber below substrates 12 as illustrated in the Love et al patent. The samples discussed below were made with overhead cathodes.

Sample devices having the structure illustrated in FIG. 1 were fabricated using apparatus as illustrated in FIG. 2. In manufacturing these samples, the metallic targets were bonded to the surface of cathodes 24 and were 14⅞ inches long, 4¾ inches wide and ¼ inch thick. In contrast to the reactive sputtering technique of Love et al wherein multiple elements were sputtered from a given cathode, only a single element was sputtered from each of the cathodes 24 of FIG. 2. These elements included chromium, molybdenum, copper and indium with each element being provided as a target having the specified dimensions. For all depositions the vacuum chamber was maintained at a pressure of 10 millitorr of argon gas and substrates 12 were neither heated nor cooled. A first layer of chromium, approximately 500 angstroms thick, was deposited on soda lime glass substrate 12 by providing a cathode voltage of between 295 and 305 volts and current density of 5.0 to 5.5 ma/cm$^2$ (milliamps per square centimeter). These conditions resulted in a deposition rate of about 21 angstroms per second. An approximately two micron thick layer of molybdenum was deposited by providing a cathode voltage between 340 and 350 volts DC and current density of about 28.5 to 29.6 ma/cm$^2$. These conditions provided a molybdenum deposition rate of about 125 angstroms per second. A 2000 angstrom thick layer of copper was deposited by providing a cathode voltage between 388 and 395 volts DC and current density of 5.2 to 5.5 ma/cm$^2$. Copper deposition rate was about 64 angstroms per second. Indium was deposited by providing a cathode voltage of from 400 to 410 volts DC and current density of 5.2 to 5.5 ma/cm$^2$, which conditions provided a deposition rate of about 66 angstroms per second. For a given speed of substrate movement over the cathodes 12 the total film thickness deposited can be adjusted over a considerable range of adjusting cathode voltage and resulting current. Thicker films can be achieved by using two or more cathodes for the same material.

In a production situation each of these layers could be deposited sequentially in a single vacuum chamber and in a single pass of the substrate 12 through the chamber. For the experimental research devices which have been made, only a single material was deposited on a single pass of the substrate 12 through the vacuum chamber. This, of course, allows better control of the process and allows observation or measurement of each layer to determine that it is properly deposited. At the given deposition rates the final thicknesses of some layers, for example molybdenum, were achieved by depositing the same material on two sequential passes. While the chamber had ten cathode structures it can be seen that only four were utilized in manufacturing the samples. In a production situation the equivalent of a double pass can of course be achieved by using two cathodes to deposit the same material, for example molybdenum.

As the process has been thus far described a layer of indium about 4000 angstroms thick has been deposited over a layer of copper about 2000 angstroms thick which provides a desired atomic ratio of about 1.0. The copper indium diselenide semiconductor layer 16 of FIG. 1 is then formed by a process known as selenization. The substrate with the composite copper and indium films is placed in a separate furnace where it is heated to approximately 400° C. in the presence of a gas containing selenium, preferably 3% to 15% H$_2$Se diluted in argon, for approximately one hour and thereafter annealing the material an additional two hours at the same temperature. As a result of this process, the copper, indium and selenium interdiffuse and react to form a high quality copper indium diselenide film having a thickness of about 1.5 to 2.0 microns.

Having thus formed a good CIS film, a photovoltaic device may be completed by depositing various window layer materials thereon. As illustrated by the above-referenced patents, cadmium sulfide is a typical material used as a window layer. However, in the preferred embodiment, an essentially transparent zinc oxide film was used for this purpose. This film was deposited by a chemical vapor deposition (CVD) process. The substrate 12 with the film 16 was placed in a vacuum chamber on a heated support. The chamber was evacuated and substrate temperature was adjusted to about 150° C. and allowed to stabilize for about twenty minutes. For a total substrate area of about one square foot, the high resistivity zinc oxide layer 18 was formed by providing reactive gases comprising 8 sccm (standard cubic centimeters per minute) of diethyl zinc, 10 sccm $H_2O$ and 186 sccm of argon at a pressure of about 0.86 torr while the initial temperature was maintained. Under these conditions a zinc oxide film of from 700 to 2000 angstroms thickness can be deposited in a time of two to six minutes. Layer 20 was then deposited by continuing the process with a different reactive gas mixture. This mixture included 8 sccm diethyl zinc, 10 sccm $H_2O$, 0.075 sccm. $B_2H_6$ and 200 sccm argon. A high conductivity layer 18 having a thickness of about 1 micron may be deposited under these conditions in about thirty minutes process time.

The metal current collecting grid 22 may be formed on layer 20 using aluminum or silver metal deposited by any of the well-known methods.

Devices manufactured by this process have provided photovoltaic efficiencies exceeding 7%. Sample devices in which layers 18 and 20 were formed from CdS, as taught in the Mickelsen et al and Love et al patents, but which were otherwise identical also provided efficiencies in excess of 7%. The sample devices had areas of four square centimeters which were relatively large compared to many of the reported research devices. The processes were actually performed on three by three arrays of square substrates each ten centimeters by ten centimeters placed on a carrier having overall dimensions of about one foot by foot. As noted above, the cathode target had an overall length of 14⅞ inch. As is known in the DC magnetron sputtering art, there is some edge effect or non-uniformity over an approximately three inch region at the ends of each cathode. However, such non-uniformity is relatively repeatable from one cathode to the next. As noted above and in various references, the most critical factor in achieving good CIS films is providing the proper ratio of copper to indium deposited. Therefore, while CIS film thickness may vary near the ends of the cathodes 24, this tends to have only a secondary affect on overall device quality since proper copper to indium ratios can still be achieved. In a production situation cathodes having essentially any desired length may be used thereby providing not only good stoichiometric ratio but also very uniform film thickness over the entire width of substrates having dimensions of four feet or more.

While the above cited references illustrate that numerous techniques have been used to deposit CIS films with mixed results, the above-described process appears to be the optimum for a production situation. As described above, many of the layers needed to fabricate a given device may be deposited in a single pass through a single vacuum chamber. By depositing separate materials from separate cathodes, better precision and uniformity in deposition of each layer can be achieved in an essentially simultaneous process. Thus, the rate of deposition from each cathode is easily controlled by adjustment of the cathode power over a considerable range. As noted above, effective deposition rate can also be increased simply by using multiple cathodes for a given material. In any case, the electrical control of deposition rate lends itself well to automatic computer process control.

While the separate selenization step would appear to increase process time and complexity, it should reduce costs in a production situation. This is in part due to the fact that selenium is quite different from copper and indium and causes numerous problems when included in the vacuum chamber in which the metals are deposited. This is particulary true in a reactive deposition process where the substrates must be heated. The high temperatures affect many parts of the vacuum chamber, e.g. the conveyor belt and rollers. The high vapor pressure of selenium insures that in a heated system all parts of the chamber will be exposed to and can be damaged by selenium for example, the target materials tend to react with selenium and this "poisoning" interferes with control of the deposition process. The presence of selenium in a heated system also increases the risk of loss of a dangerous material from the chamber. The present invention avoids these problems by removing selenium from the vacuum system and operating at room temperature during deposition of copper and indium. Selenization occurs in a separate furnace with no moving parts to be affected by the heat and can be performed at atmospheric pressure. While operating in the batch process mode, the furnace can have a large volume and therefore a high throughput. The net result of this process is an overall cost reduction.

It will be appreciated that all of the benefits of the present invention can be achieved regardless of the order of deposition of the copper and indium films. That is, the indium could be deposited first or the films could be deposited as a sandwich or stack of thinner layers. The preferred embodiment uses the one layer of indium on one layer of copper process because it corresponds to the order used in other deposition processes and has given good results.

THEORY OF OPERATION

In addition to the production control advantages of the present invention which are discussed above, we believe that the improved results which have been achieved result from certain unexpected advantages of the DC magnetron sputtering process. In particular, we believe that the improved efficiency, that is 7%, which we have achieved as compared to the 2-3% efficiency as previously reported, results from production of an improved CIS layer. We believe that the improved CIS layer results primarily from an unexpected mixing or alloying of the copper and indium during the deposition process. It appears that when copper and indium are sequentially deposited by DC magnetron sputtering in the same vacuum chamber, the indium particles transfer to the copper film, and to the substrate, sufficient energy to cause mixing of the two materials. Such mixing is not believed to occur in other processes for depositing pure materials. The mixing or alloying results in an improved homogeneity or advantageous morphology of the composite copper and indium film. This improved structure is carried over into the desired CIS film after the selenization step.

The improved structure of the composite copper and indium film is also believed to improve the reaction of the composite film with the source of selenium. Both copper and indium form various compounds individually with selenium, none of which are known to be useful or desirable as a semiconductor. In prior methods where copper and indium are deposited separately as pure materials, the composite film comprises a film of pure copper covered by a separate film of pure indium. In the selenization step the indium was therefore first exposed to the selenium and could form various compounds with selenium. Only after these compounds finally alloyed with the underlying copper film would copper indium diselenide be formed. The prior mixing or alloying of copper and indium, which occurs when the current invention is practiced allows both of the metals to form compounds with selenium at essentially the same time and place, thereby minimizing or avoiding formation of intermediate compounds. The net result appears to be a more homogeneous copper indium diselenide film with a greater degree of control over surface morphology. We believe that this results in the improved performance with devices we have manufactured.

The composite film of copper and indium produced by practice of the present invention is quite rugged, that is it has considerable mechanical hardness. In the prior art composite films, the upper surface comprised a film of pure indium whichis extremely soft and can be easily damaged. The improved durability of the composite copper and indium film according to the present invention greatly simplifies handling of substrates and increases manufacturing yields.

While the present invention has been illustrated and described with reference to particular apparatus and methods of operation, it will be apparent that various modifications and changes can be made therein within the scope of the appended claims.

What is claimed is:

1. A method for fabricating a copper indium diselenide semiconductor film comprising:
   in a single vacuum chamber sequentially depositing a film of copper on a substrate by DC magnetron sputtering from a first cathode and depositing indium on said film of copper by DC magnetron sputtering from a second cathode to form a composite film of copper and indium; and
   heating said composite film of copper and indium in the presence of a source of selenium at a temperature and for a time selected to cause interdiffusion of copper, indium and selenium to form a copper indium diselenide film.

2. A method according to claim 1 wherein said copper and indium are deposited in said single vacuum chamber by continuously moving said substrate past said first and second cathodes.

3. A method according to claim 1 wherein said substrate includes a metallic current collecting film and said film is deposited on said substrate before deposition of said film of copper by DC magnetron sputtering from a third cathode.

4. A method according to claim 3 wherein said current collecting film, said film of copper and said indium are deposited sequentially in said single vacuum chamber by continuously moving said substrate past said third, first and second sputtering cathodes.

5. A method according to claim 1 wherein said substrate includes a metallic current collecting film and said film is deposited on said substrate before deposition of said film of copper by:
   depositing a layer of chromium on said substrate by DC magnetron sputtering from a third cathode; and
   depositing a layer of molybdenum on said chromium layer by DC magnetron sputtering from a fourth cathode.

6. A method according to claim 1 wherein said substrate is neither heated nor cooled during said depositing steps.

7. A method according to claim 1 wherein;
   said film of copper is deposited to a thickness of from about 200 to about 2000 angstroms, and
   indium is deposited to a thickness of from about 400 to about 4000 angstroms,
   said thicknesses being selected to provide an atomic ratio of copper to indium of about one.

* * * * *